United States Patent
Zhang et al.

(10) Patent No.: US 8,723,159 B2
(45) Date of Patent: May 13, 2014

(54) DEFECT-CONTROLLING STRUCTURE FOR EPITAXIAL GROWTH, LIGHT EMITTING DEVICE CONTAINING DEFECT-CONTROLLING STRUCTURE, AND METHOD OF FORMING THE SAME

(75) Inventors: Jianping Zhang, El Monte, CA (US); Hongmei Wang, El Monte, CA (US); Chunhui Yan, El Monte, CA (US)

(73) Assignee: InvenLux Corporation, El Monte, CA (US)

( * ) Notice: Subject to any disclaimer, the term of this patent is extended or adjusted under 35 U.S.C. 154(b) by 304 days.

(21) Appl. No.: 13/028,055

(22) Filed: Feb. 15, 2011

(65) Prior Publication Data

US 2012/0205616 A1 Aug. 16, 2012

(51) Int. Cl.
*H01L 33/12* (2010.01)
(52) U.S. Cl.
USPC .................. 257/14; 257/E33.008; 977/773
(58) Field of Classification Search
None
See application file for complete search history.

(56) References Cited

U.S. PATENT DOCUMENTS

| | | | | |
|---|---|---|---|---|
| 6,233,265 B1 * | 5/2001 | Bour et al. | | 372/45.01 |
| 7,265,374 B2 * | 9/2007 | Lee et al. | | 257/13 |
| 7,294,202 B2 | 11/2007 | Chen et al. | | 117/94 |
| 7,361,576 B2 | 4/2008 | Imer et al. | | 438/479 |
| 7,772,585 B2 | 8/2010 | Uematsu et al. | | 257/13 |
| 7,781,247 B2 | 8/2010 | Tran | | 438/47 |
| 2007/0108888 A1 * | 5/2007 | Chen et al. | | 313/503 |
| 2009/0134380 A1 | 5/2009 | Chen | | 257/13 |
| 2009/0134406 A1 * | 5/2009 | Chen | | 257/79 |
| 2009/0181484 A1 | 7/2009 | Lee et al. | | 438/42 |
| 2010/0032645 A1 | 2/2010 | Choi et al. | | 257/13 |
| 2011/0024880 A1 | 2/2011 | Li et al. | | 257/618 |

OTHER PUBLICATIONS

George T. Wang et al., "Final LDRD Report: Low Dislocation GaN via Defect-Filtering, Self-Assembled $SiO_2$—Sphere Layers" Prepared by Sandia National Laboratories, operated for the US Department of Energy by Sandia Corporation, (Sep. 2009), SAND2009-6153.
U.S. Appl. No. 12/953,290, Jingping Zhang et al, filed Nov. 23, 2010.
Notification of Transmittal of the International Search Report and the Written Opinion of the International Searching Authority, or the Declaration in a corresponding PCT application No. PCT/US2012/025317, dated Jul. 31, 2012 of which where the listed US references were cited.

* cited by examiner

*Primary Examiner* — Wensing Kuo
(74) *Attorney, Agent, or Firm* — J.C. Patents

(57) ABSTRACT

A method for reducing dislocations or other defects in a light emitting device, such as light emitting diode (LED), by in-situ introducing nanoparticles into at least one of a defect-controlling layer, an n-type layer, a p-type layer, and a quantum well of the light emitting device. A light emitting device is provided, and nanoparticles are dispensed in-situ in at least one of a defect-controlling layer, an n-type layer, a p-type layer, and a quantum well of the light emitting device.

23 Claims, 8 Drawing Sheets

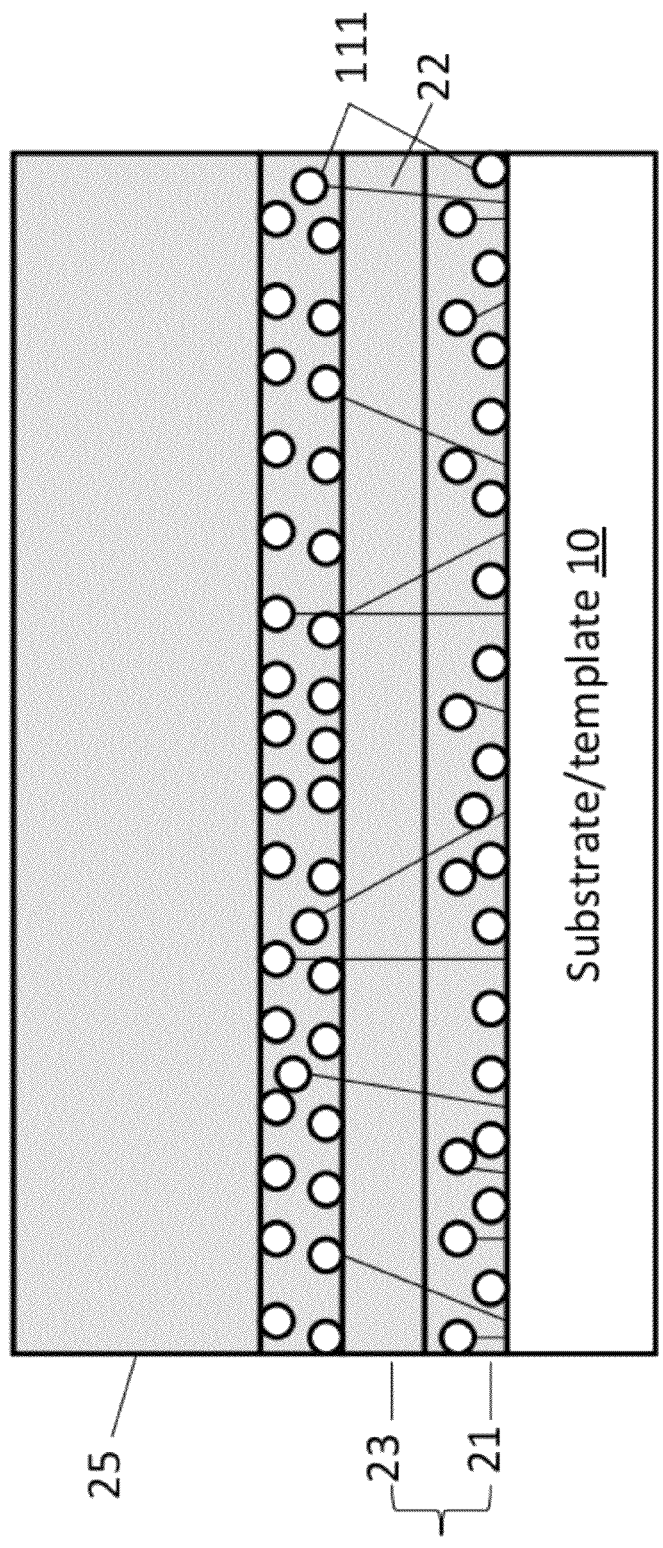

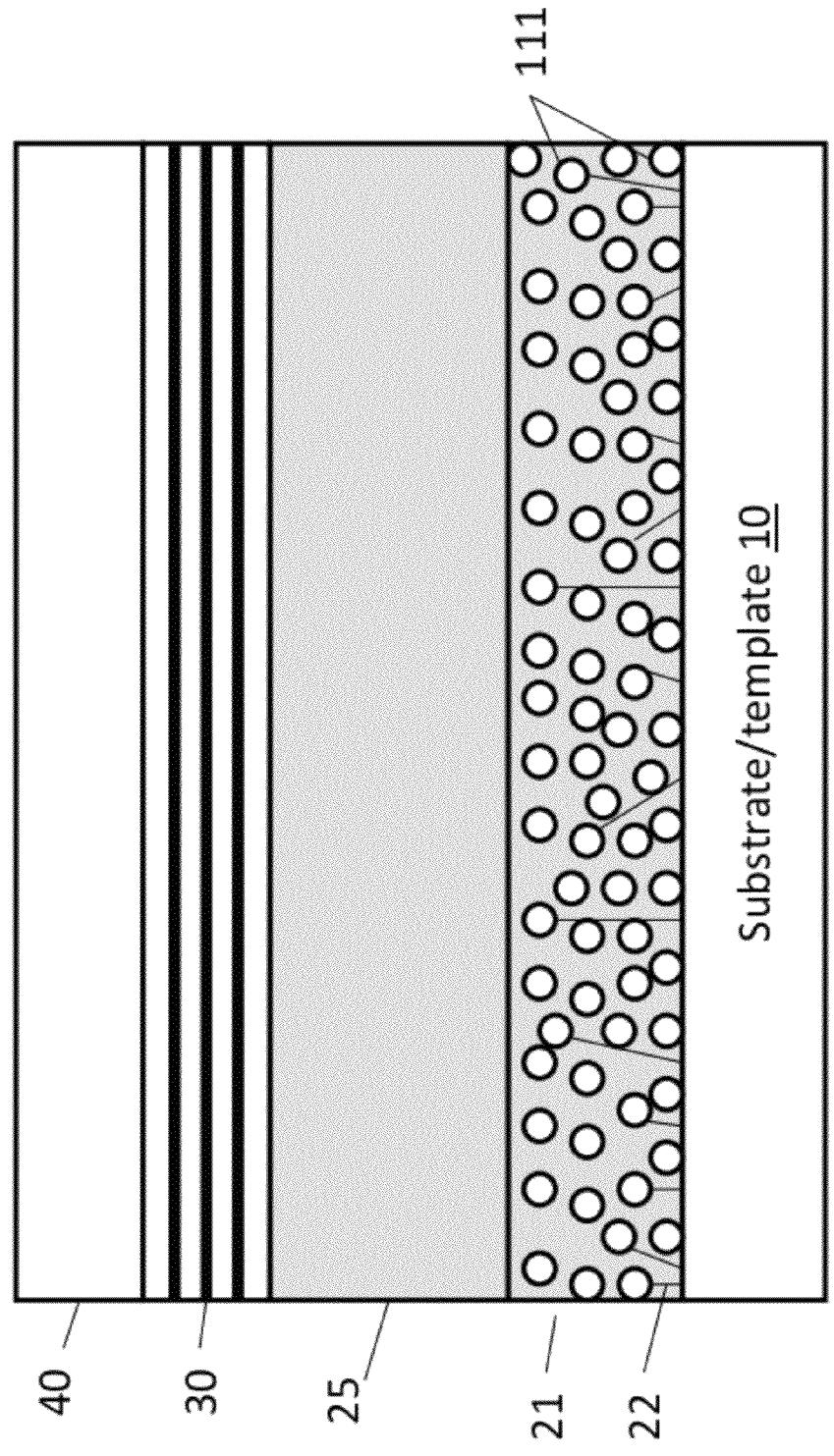

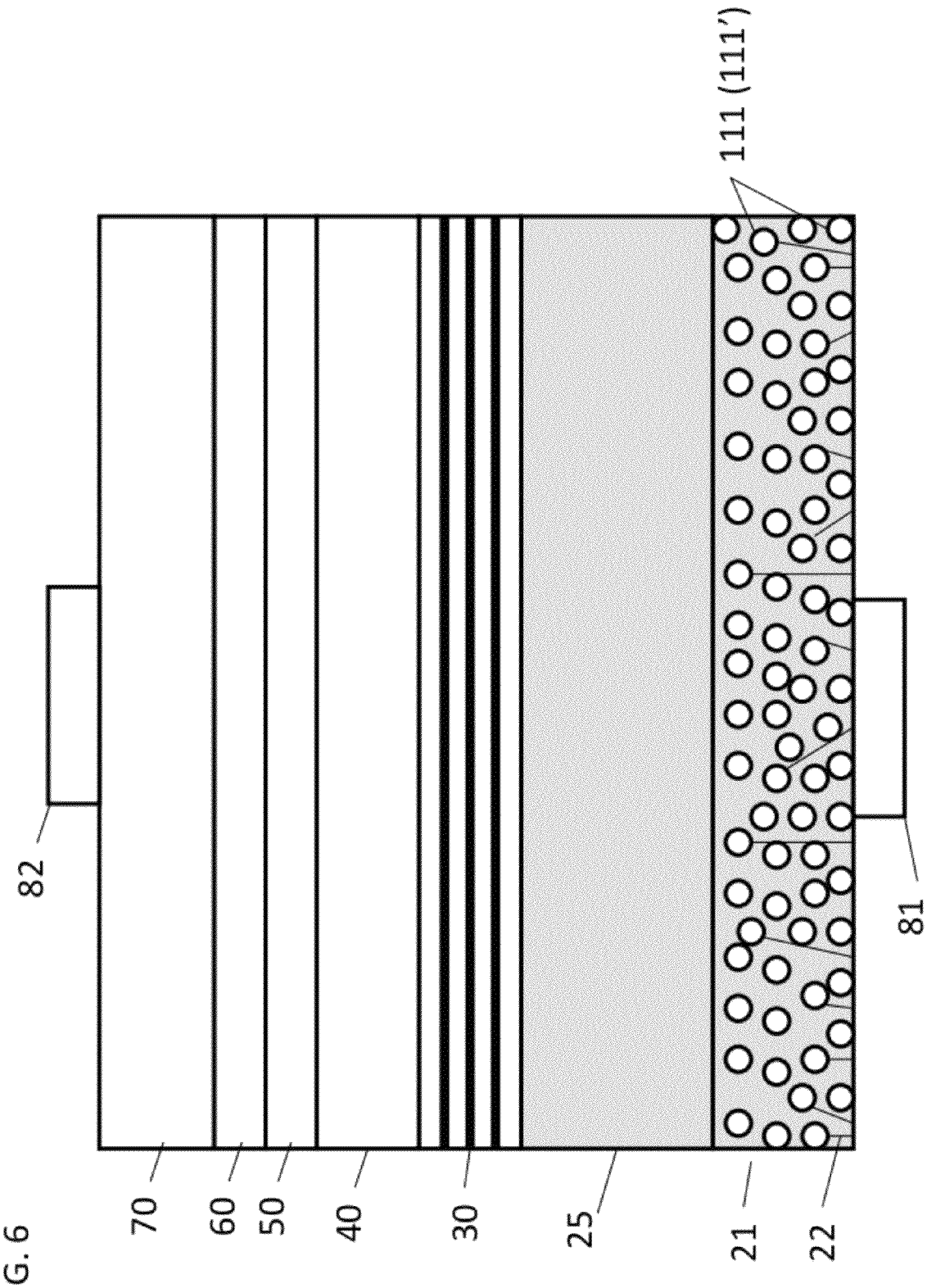

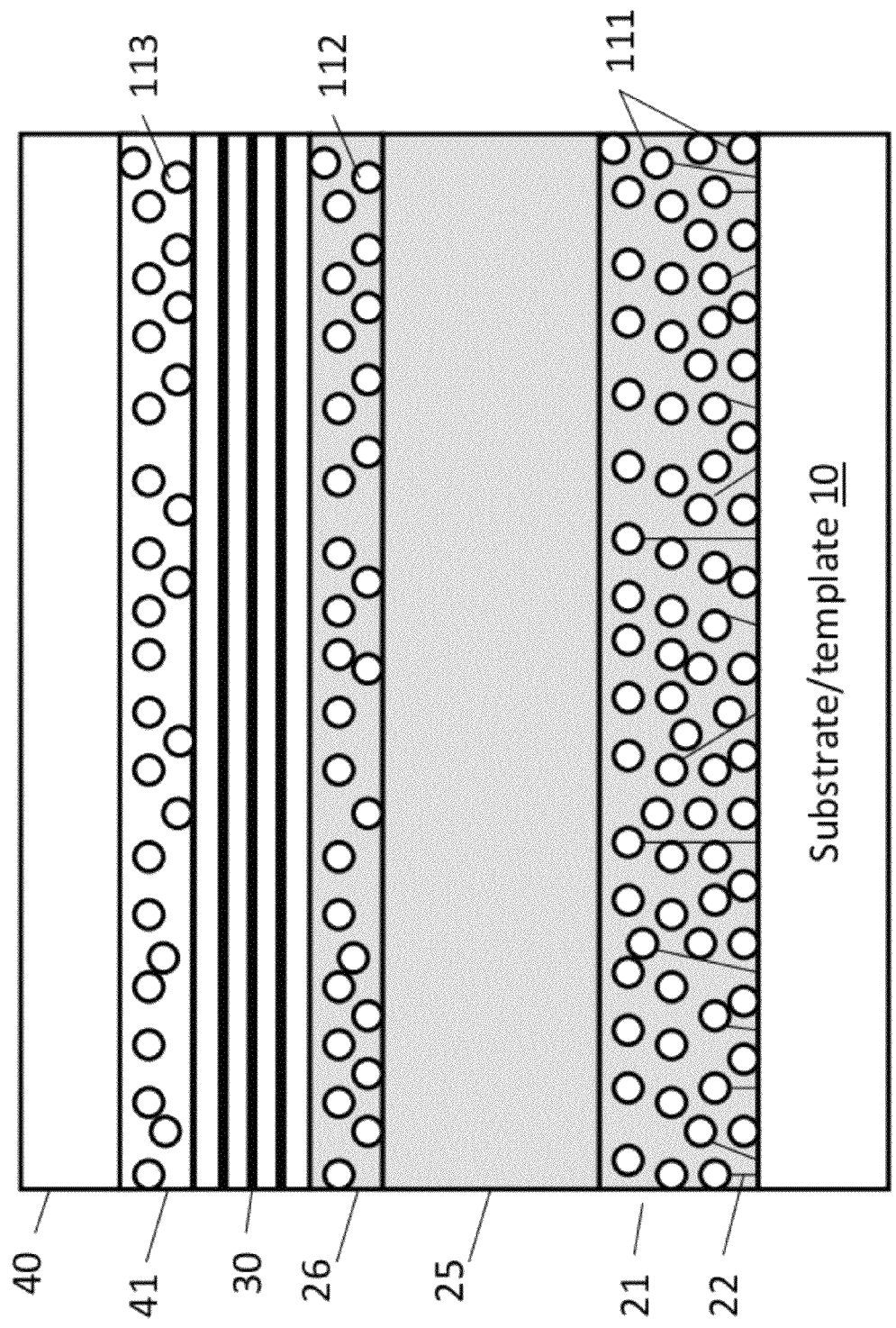

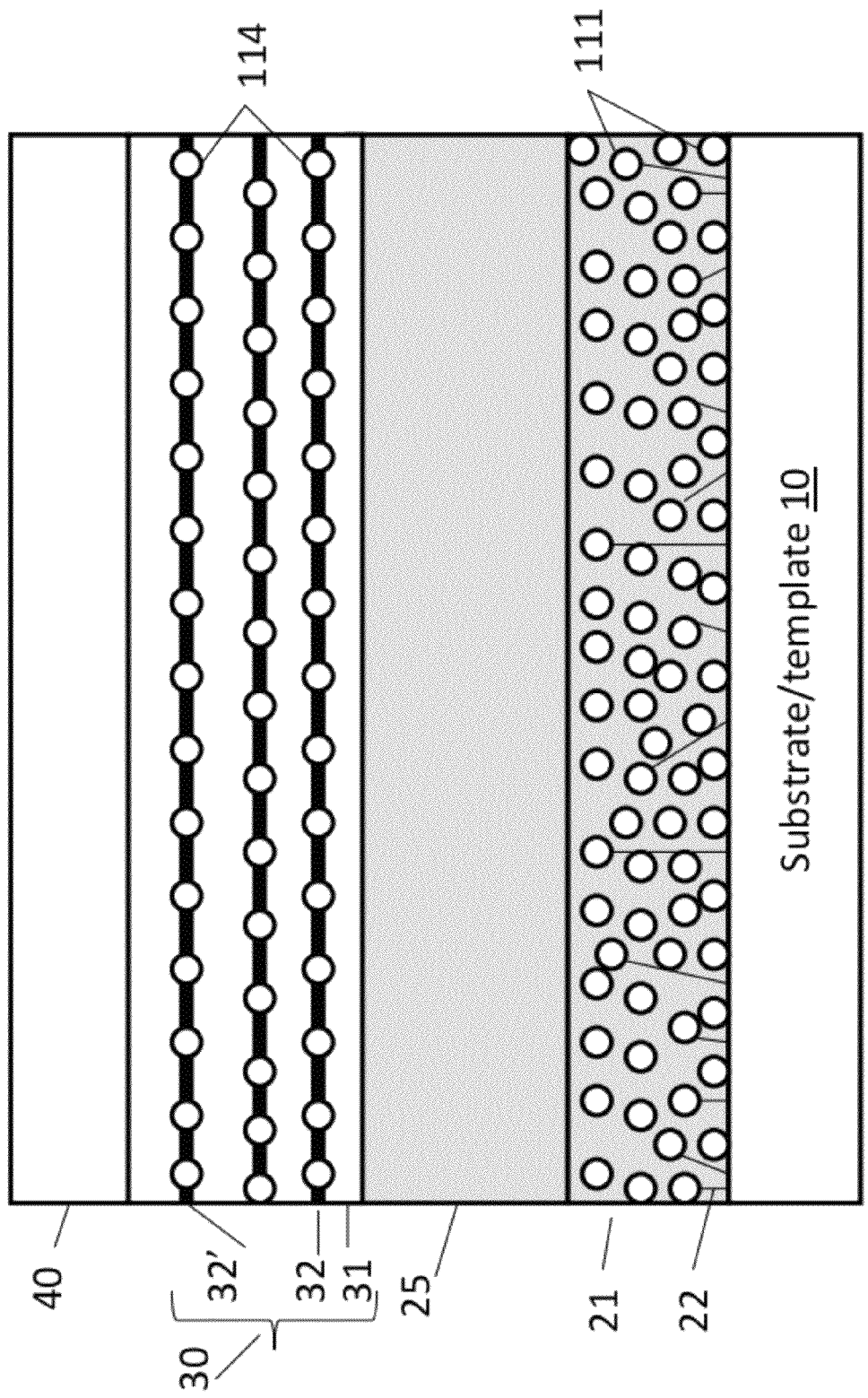

DEFECT-CONTROLLING STRUCTURE FOR EPITAXIAL GROWTH, LIGHT EMITTING DEVICE CONTAINING DEFECT-CONTROLLING STRUCTURE, AND METHOD OF FORMING THE SAME

1. FIELD OF THE INVENTION

The present invention relates in general to nanoparticle-containing semiconductor material and device containing such material; more particularly to defect-controlling structure for III-nitride epitaxial growth, III-nitride light-emitting device containing defect-controlling structure, and method for forming the same.

2. DESCRIPTION OF THE RELATED ART

III-nitride compound semiconductors including InN, GaN, AlN and their ternary and quaternary compounds possessing bandgap energy varying from 0.7 eV to 6.2 eV, covering the whole visible spectrum, are the ideal material system for visible light emitters for applications in decoration, displays, and general lighting. GaN-based InGaN active-region blue, green and white light-emitting diodes (LEDs) are commercialized, though to be widely adopted in general lighting, their luminous efficacies need further improvement. One approach to boost luminous efficacy is to improve LED's internal quantum efficiency by reducing material defect density within the LED structure. The state-of-the-art GaN based LED structures suffer from material defects, such as dislocations with density above $10^8$ cm$^{-2}$, as a result of heteroepitaxy of GaN on foreign substrates such as silicon, sapphire, and silicon carbide.

Another approach to boost luminous efficacy is to improve LED's internal quantum efficiency by implementing quantum-dot type active-regions since carriers confined in quantum dots have the highest radiative recombination rate.

In the prior art, to reduce dislocations in GaN layers, epitaxial lateral overgrowth (ELOG) approach has been invented. The ELOG process consists of depositing a GaN template layer over a foreign substrate in a reactor, forming a growth mask over the GaN template layer in another reactor, and resuming growth on the masked template in a third reactor. GaN growth on the masked template starts with a selective growth behavior. That is to say, growth initiates on the unmasked areas, and is prohibited on the masked areas. Lateral growth proceeds when growth on the unmasked area reaches a certain thickness, eventually resulting in complete lateral growth over the masked areas. The laterally overgrown areas possess much less dislocation density. Examples of ELOG can be found in U.S. Pat. No. 7,361,576 and references therein. Similarly, in U.S. Pat. No. 7,772,585, a growth mask is also introduced (formed ex-situ) to control growth facet and to reduce dislocations. The contents of U.S. Pat. No. 7,361,576 and U.S. Pat. No. 7,772,585 are herein incorporated by reference in their entirety.

What is needed is a more effective and cost-efficient approach to reduce dislocations in GaN based materials and increase internal quantum efficiency of InGaN-based active-regions.

3. SUMMARY OF THE INVENTION

The present invention provides a cost-effective approach to reduce dislocations or other defects in semiconductor epitaxial layers, such as III-nitride layers, by in-situ introducing nanoparticles into the epitaxial layers.

The present invention provides a cost-effective approach to reduce dislocations or other defects in a light emitting device, such as light emitting diode (LED), by in-situ introducing nanoparticles into at least one of a defect-controlling layer, an n-type layer, a p-type layer, and a quantum well of the light emitting device.

One aspect of the present invention provides a light emitting device, which comprises a defect-controlling layer with nanoparticles dispensed therein and a light emitting diode structure formed on the defect-controlling layer, wherein the nanoparticles are dispensed in the defect-controlling layer in-situ while the defect-controlling layer is formed. The light emitting diode structure comprises an n-type layer, a p-type layer, and an active region sandwiched therebetween, and the n-type layer is formed on the defect-controlling layer as a separate layer or as an integral part of the defect-controlling layer.

Another aspect of the present invention provides a method for forming a light emitting device, which comprises:
providing a substrate;
epitaxially growing a defect-controlling layer over the substrate in a reactor, and introducing nanoparticles into the reactor so as to dispense the nanoparticles in-situ in the defect-controlling layer; and
forming a light emitting diode structure on the defect-controlling layer, wherein the light emitting diode structure comprises an n-type layer, a p-type layer, and an active region sandwiched therebetween, and the light emitting active region comprises one or more quantum wells and one or more quantum barriers alternately arranged with said one or more quantum wells.

The method comprises epitaxially growing the n-type layer on the defect-controlling layer as a separate layer or as an integral part of the defect-controlling layer.

Another aspect of the present invention provides a light emitting device, which comprises a light emitting diode structure comprising an n-type layer, a p-type layer, and an active region sandwiched therebetween, wherein the active region comprises one or more quantum wells and at least one quantum well contains nanoparticles dispensed therein in-situ while forming the quantum well. The light emitting device may further comprise a defect-controlling layer on which the light emitting diode structure is formed, wherein nanoparticles are dispensed in the defect-controlling layer.

Another aspect of the present invention provides a method for forming light emitting device, which comprises:
providing a substrate in a reactor;
forming a light emitting diode structure over the substrate, wherein the light emitting diode structure comprises an n-type layer, a p-type layer, and an active region sandwiched therebetween, and the light emitting region comprises one or more quantum wells and one or more quantum barriers alternately arranged with said one or more quantum wells;
wherein nanoparticles are introduced into the reactor while epitaxially growing at least one of said one or more quantum wells, so that the nanoparticles are incorporated in-situ in said at least one quantum well.

The method may further comprise epitaxially growing a defect-controlling layer over the substrate, and introducing nanoparticles into the reactor while epitaxially growing the defect-controlling layer, so that the nanoparticles are dispensed in-situ in the defect-controlling layer.

Another aspect of the present invention provides a light emitting device, which comprises a light emitting diode structure comprising an n-type layer, a p-type layer, and an active region sandwiched therebetween, wherein the active region comprises one or more quantum wells and at least one quantum well contains nitride nanoparticles formed in-situ.

Another aspect of the present invention provides a method for forming a light emitting device, which comprises:

providing a substrate in a reactor;

forming a light emitting diode structure over the substrate, wherein the light emitting diode structure comprises an n-type layer, a p-type layer, and an active region sandwiched therebetween, and the light emitting region comprises one or more quantum wells and one or more quantum barriers alternately arranged with said one or more quantum wells;

wherein forming the light emitting diode structure comprises:

forming nitride nanoparticles in situ in gaseous phase in the reactor, and depositing the nitride nanoparticles on at least one quantum barrier; and epitaxially growing at least one quantum well on the quantum barrier on which the nitride nanoparticles are deposited.

Another aspect of the present invention provides a defect-controlling structure for a semiconductor device, which comprises:

a substrate;

a defect-controlling layer epitaxially grown over the substrate, wherein nanoparticles are dispensed in the defect-controlling layer in-situ while growing the defect-controlling layer; and an epitaxial layer on the defect-controlling layer.

Another aspect of the present invention provides a method for forming a defect-controlling structure for a semiconductor device, which comprises:

providing a substrate;

epitaxially growing a defect-controlling layer over the substrate in a reactor, and introducing nanoparticles into the reactor so as to dispense the nanoparticles in-situ in the defect-controlling layer; and epitaxially growing an epitaxial layer on the defect-controlling layer.

4. BRIEF DESCRIPTION OF THE DRAWINGS

The accompanying drawings, which are included to provide a further understanding of the invention and constitute a part of this application, illustrate embodiments of the invention and together with the description serve to explain the principle of the invention, but are not intended to limit the scope of the present invention. Like reference numbers in the figures refer to like elements throughout, and a layer can refer to a group of layers associated with the same function. Throughout the present specification, the terms "nitride" and "III-nitride" are used exchangeably.

FIG. 4 illustrates the formation of high-quality nitride layers according to one aspect of the present invention.

FIG. 5 illustrates the cross-sectional structure of a light-emitting device structure according to one aspect of the present invention.

FIG. 6 illustrates the cross-sectional structure of a thin film vertical light-emitting diode according to one aspect of the present invention.

FIG. 7 illustrates the cross-sectional structure of a light-emitting device structure according to one aspect of the present invention.

FIG. 8 illustrates the cross-sectional structure of a light-emitting device structure according to one aspect of the present invention.

5. DETAILED DESCRIPTION OF EMBODIMENTS

Figure 1:
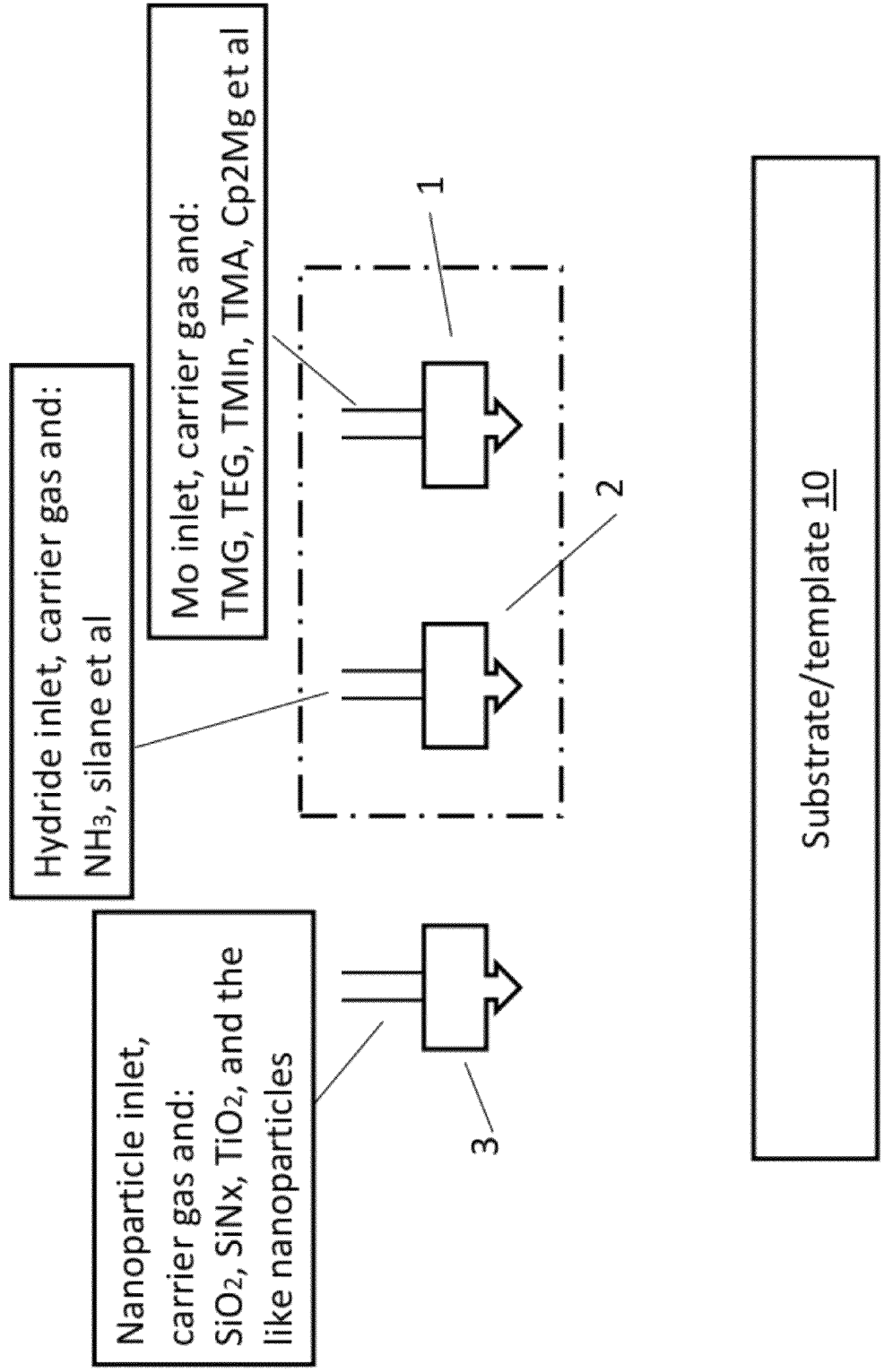
FIG. 1 illustrates a vapor phase epitaxy process according to an embodiment of the present invention.

According to an embodiment of the present invention, III-nitride layers such as GaN, InGaN and AlGaN layers are formed by vapor phase epitaxy. In addition to the conventional sources such as metalorganic sources of Trimethylgallium (TMG), Trimethylaluminium (TMA), Trimethylindium (TMIn) and hydride source of ammonia ($NH_3$), a nanoparticle source is also provided and nanoparticles are simultaneously introduced into a vapor phase epitaxy reactor during the vapor phase epitaxy growth of an epitaxial layer for a predetermined period of time. The nanoparticle source can contain silicon dioxide ($SiO_2$), silicon nitride ($SiN_x$), titanium dioxide ($TiO_2$) nanoparticles. The dimension or size of the nanoparticles can be in the range of 1-100 nanometers (nm). The nanoparticles are carried into a vapor phase epitaxy reactor by a carrier gas. The epitaxially grown nitride layers accordingly contain nanoparticles in-situ dispensed therein. And dislocations arising from the substrate-epilayer interface are blocked by those nanoparticles, resulting in high-quality nitride layers with significantly reduced dislocations.

According to another embodiment of the present invention, the supply of $SiO_2$, or $SiN_x$, or $TiO_2$ nanoparticles and metalorganic sources can be introduced into a vapor phase epitaxy reactor alternately for multiple times, such as 1-50 times, or 5-20 times, forming nanoparticle-containing layer/non-nanoparticle layer stacks. This can be achieved by alternately shutting down the nanoparticles and metalorganic sources, or periodically shutting down only the nanoparticles source while keeping the supply of metalorganics. Threading dislocations are blocked by nanoparticles, resulting in high-quality nitride above the nanoparticles.

A semiconductor device such as a light-emitting diode structure can be formed on the nanoparticle-containing high-quality nitride layer for better internal quantum efficiency and better light extraction efficiency since the nanoparticles terminate threading dislocations and scatter light.

In some embodiments according to the present invention, nanoparticles of $SiO_2$, $SiN_x$, $TiO_2$, and the like can be introduced in the vicinity of the active-region. For example, for a III-nitride active region, nanoparticles can be introduced in-situ in an n-type layer and/or a p-type layer which is adjacent to the III-nitride active region, or in a portion of the n-type layer and/or a portion of the p-type layer which is adjacent to the III-nitride active region. The term "III-nitride active region" as used here means that the quantum wells and the quantum barriers in the active region are made of III-nitride. These nanoparticles may help light-extraction efficiency of the active-region.

In some embodiments according to the present invention, nanoparticles of $SiO_2$, $SiN_x$, $TiO_2$, or the like can be introduced in-situ in one or more quantum wells during the formation of the quantum well(s). These nanoparticles modify the two-dimensional quantum well into zero-dimensional quantum dots or quantum disks, resulting in enhanced internal quantum efficiency for the light-emitting device. In other embodiments according the present invention, nitride nanoparticles of AlN, GaN, or AlGaN and other III-nitride nanoparticles are formed in situ by gaseous-phase reaction of metalorganics and ammonia in gaseous phase in the reactor and deposited in-situ on a quantum barrier, such as a III-nitride quantum barrier, just before the growth of a quantum well, such as a III-nitride quantum well, on the quantum barrier. These nanoparticles modify the two-dimensional quantum wells into zero-dimensional quantum dots or quantum disks, resulting in enhanced internal quantum efficiency for the light-emitting devices.

In the prior art, the formation of nitride layers is achieved by introducing metalorganics such as TMG, TMA, TMIn and $NH_3$ into a vapor phase reactor such as a metalorganic chemical vapor deposition (MOCVD) reactor. Such conventional method of growing epitaxial nitride layers is also used in the present invention. Shown in FIG. 1, a substrate or template 10 is loaded into a reactor and heated at elevated temperatures for epitaxial growth. As used throughout this disclosure, the term "template" means at least one epitaxial layer formed on top of a substrate for successive epitaxial layer deposition. Substrate 10 can be made of sapphire, silicon carbide, silicon, III-nitride, gallium arsenide, indium phosphide, germanium, or other suitable material with any desired orientation. The template can be one or more epitaxial nitride layer(s) formed on substrate 10. Throughout this specification, a layer to be formed directly on a substrate usually can also optionally be formed directly on a template formed on a substrate. Shown in FIG. 1, metalorganics are introduced into the reactor (Throughout this disclosure, whenever it mentions introducing an ingredient in a reactor, that means the ingredient is introduced in a reaction chamber of the reactor where epitaxial growth or deposition or gaseous phase reaction takes place.) via flow control mechanism 1, hydrides such as ammonia and silane are introduced into the reactor via flow control mechanism 2, so that AlInGaN nitride layers of any composition can be formed over substrate/template 10. The flow control mechanism can consist of mass flow controllers, pressure controllers, on/off valves, and a control computer. In addition to the metalorganic sources and hydride sources, according to the present invention, a flow control mechanism 3 is provided to introduce nanoparticles into the reactor. The nanoparticles to be injected into the reactor can be $SiO_2$, $SiN_x$, $TiO_2$, and the like nanoparticles. The nanoparticles' dimension can be in the range of 1-100 nm, for example 1-50 nm. These nanoparticles are available from several vendors with high purity, such as 99.999%. Nanoparticles with larger dimension, such as 100-400 nm, 100-200 nm may be used in some embodiments of the present invention. Carrier gas for these nanoparticles can be hydrogen or nitrogen. Generally, suitable nanoparticles have a non-crystal structure or a crystal structure significantly different from that of the epitaxial layer in which the nanoparticles are to be dispensed, for example, difference in the lattice constant between the two is significantly large that the surface energy for epitaxial growth to take place on the nanoparticles is not energetically favorable, for example, the lattice difference is larger than 15%. There is no specific requirement for the shape and size distribution of the nanoparticles. And the nanoparticles are preferred to be transparent and chemically and thermally stable. The purity of the nanoparticles can be more than 99.9%, such as more than 99.99%.

Figure 2:
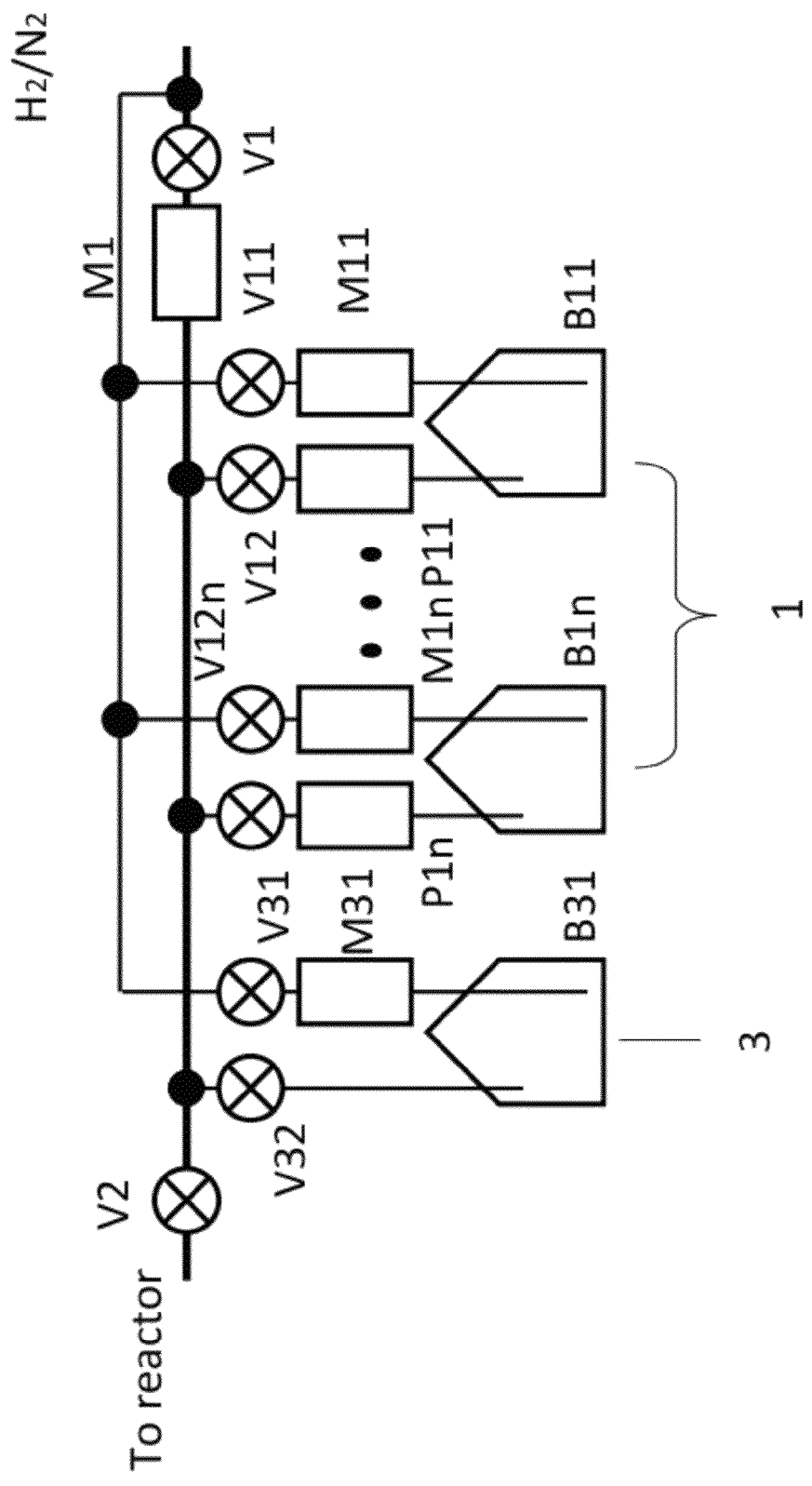
FIG. 2 illustrates a nanoparticle introduction mechanism during vapor phase epitaxy according to an embodiment of the present invention.

According to one aspect of the present invention, commercial MOCVD systems can be modified to introduce nanoparticles during nitride epitaxial growth. Shown in FIG. 2 is the schematic illustration of a source delivery system, with the nanoparticle introduction flow control mechanism 3 and metalorganic source introduction flow control mechanism 1. N different metalorganic sources are stored in n bubblers B11 to B1n, respectively. Mass flow controllers (MFCs) and pressure controllers (PCs) are used to regulate the amount of metalorganic sources at certain bubbler temperatures. For example, MFC M11 and PC P11 are coupled to control the delivery of the $1^{st}$ metalorganic source. Bubbler B31 contains the $1^{st}$ nanoparticles. Likewise, even though not shown in FIG. 2, there can be bubblers B32 to B3m to contain m different kinds of nanoparticles. MFC M31 and M1 are used to control the amount of nanoparticles delivered into the reactor. MFC M1 sets pressure for bubbler B31 by controlling the amount of carrier gas flowing through MFC M1. The source delivery system shown in FIG. 2 also includes many digital on/off valves (V1 to V32) to control source on/off states. The design ensures only high purity gas flowing through MFCs M31 and M1, avoiding any possible nanoparticles clogging in MFCs or PCs. The difference between a conventional MOCVD system and the MOCVD system shown in FIGS. 1 and 2 is the addition of the nanoparticle introduction flow control mechanism 3.

Even though shown in FIG. 2 nanoparticles are mixed with metalorganic sources before delivery into the reactor, in other embodiments, nanoparticles can be mixed with hydrides before delivery into the reactor, or in another embodiment, nanoparticles can be delivered into the reactor independently without mixing with hydrides or metalorganic sources in the delivery pipes.

Figure 3:
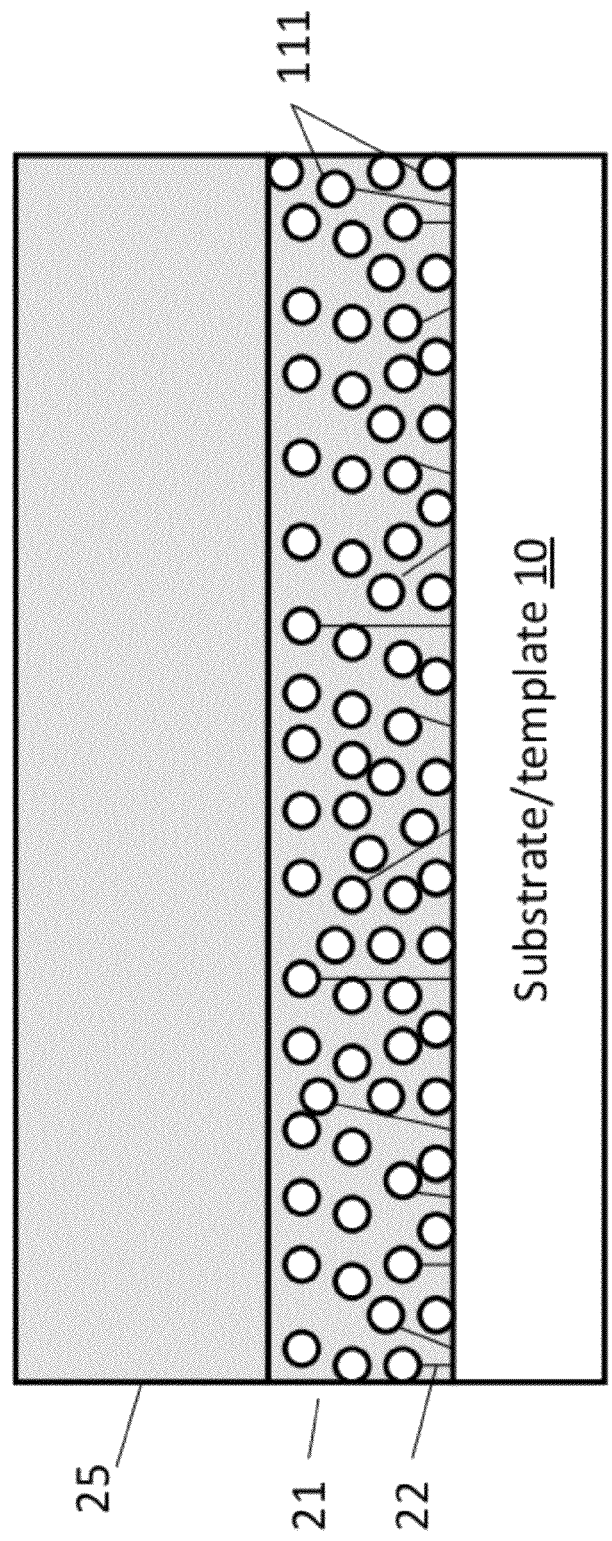
FIG. 3 illustrates the formation of high-quality nitride layers according to one aspect of the present invention.

FIG. 3 illustrates the dislocation reduction mechanism when using nanoparticles during epitaxial growth, according to one aspect of the present invention. As shown, a defect-controlling nitride layer 21, such as GaN layer, is deposited on substrate/template 10. Layer 21 may contain high-density ($>5\times10^8$ cm$^{-2}$) dislocations 22 at the bottom part close to substrate/template 10. It also contains nanoparticles 111 dispended therein as shown in FIG. 3, wherein most nanoparticles are distributed within defect-controlling layer 21, some may also deposit on surface of substrate/template 10 when the nanoparticles are introduced in the reactor at beginning of the epitaxial growth of defect-controlling layer 21. In other embodiments, the nanoparticles are not introduced in the reactor until a predetermined thickness of defect-controlling layer 21 has been grown on substrate/template 10, therefore, no nanoparticles or very few nanoparticles are deposited on the surface of substrate/template 10. Referring to FIG. 2, the flow of nanoparticles can be controlled by MFCs M31 and M1. MFC M1 sets up pressure for bubbler B31, so that carrier gas through MFC M31 can mix with nanoparticles in bubbler B31 thoroughly. Through experimental optimizations, the doping concentration of nanoparticles in layer 21 can be determined and optimized for the best film quality. In some MOCVD systems, MFC M1 can set the pressure of bubbler B31 at 200-760 torr, and MFC M31 can set hydrogen or nitrogen flow at 50-5000 sccm to get desired nanoparticle doping level in layer 21. The nanoparticles can be made of $SiO_2$, $SiN_x$, $TiO_2$, and the like, with dimension in the range of 1-100 nm. Dislocations 22 have great chance to terminate at nanoparticles 111. As a result, the top part of the defect-controlling layer 21 is of significantly reduced dislocation density, and high-quality nitride layer such as GaN layer 25 is obtained by epitaxial growth on defect-controlling layer 21, with dislocation density several orders of magnitude lower than that of the bottom part of defect-controlling layer 21. Shown in FIG. 3, layer 25 and defect-controlling layer 21 are two separate layers with distinguishable interface there-between. In other embodiments, layer 25 can be formed as an integral part of defect-controlling layer 21 by continuing the epitaxial growth of defect-controlling layer 21 without introducing nanoparticles 111, so that the lower portion of defect-controlling layer 21 contains nanoparticles 111 and the upper portion of defect-controlling layer 21 without nanoparticles forms a high-quality layer 25.

The structure shown in FIG. 3 can be fabricated in an MOCVD reactor, such as a conventional MOCVD reactor equipped with a nanoparticle deliver mechanism such as nanoparticle introduction flow control mechanism 3 shown in FIG. 2. During epitaxial growth of defect-controlling layer 21, nanoparticles 111 are simultaneously introduced into the MOCVD reactor with other sources such as TMG, TMIn, TMA, and $NH_3$. Flow control mechanism 3 shown In FIG. 2 is used to control the density of nanoparticles 111 in defect-controlling layer 21 by varying carrier gas flow rate and, thus, nanoparticle concentration in gaseous phase. Nanoparticles can be introduced into the reactor in a constant amount or a constant gaseous phase concentration so that the nanoparticles are uniformly dispersed in defect-controlling layer 21. Nanoparticles can also be introduced into the reactor in varying amount or varying gaseous phase concentration, so that nanoparticle density varies in the growth direction of defect-controlling layer 21. The nanoparticle density can be designed to gradually increase or decrease in the growth direction of defect-controlling layer 21. For example, nanoparticles 111 can have a controlled density of $10^6$-$10^{10}$ $cm^{-2}$, depending on the nanoparticle size and thickness of layer 21. The larger the nanoparticle size, the less the nanoparticle density is needed. Also, the thicker the defect-controlling layer 21, the less the nanoparticle density is needed. For example, for nanoparticles 111 with an average size of 5 nm, if the defect-controlling layer 21 is of a thickness 1 μm, the nanoparticles 111 may have a density of $5 \times 10^8$-$5 \times 10^9$ $cm^{-2}$. The epitaxial growth of defect-controlling layer 21 can be conducted under conditions known in the art for epitaxial growth.

In another embodiment shown in FIG. 4, defect-controlling layer 21 has been repeated for several times. Each time after the growth of defect-controlling layer 21, nanoparticles in gaseous phase are removed, by turning off the digital valves V31 and V32 shown in FIG. 2. Each layer 21 in FIG. 4 is followed by epitaxial growth of a recovery layer 23 which can be made of the same material as that of defect-controlling layer 21. The stacks of layer 21/layer 23 can be repeated many time, for example 1 to 50 times, for dislocation reduction. In this embodiment, the thickness of layer 21 and layer 23 can be in the range of 0.01-0.5 μm, respectively. Each defect-controlling layer 21 in the above structure defines a sublayer in the entire defect-controlling layer. Different sublayers can contain the same or different kind of nanoparticles with the same or different average sizes.

Shown in FIG. 5 is a light-emitting structure implemented with a defect-controlling layer 21. The light-emitting structure can be any conventional light-emitting diode structure. For example, layer 25 above the defect-controlling layer 21 is an n-type layer and can be made of Si-doped GaN, AlGaN, or InGaN, active-region 30 can be GaN/InGaN multiple quantum well, and layer 40 is a p-type layer and can be Mg-doped p-AlGaN, p-GaN, and/or p-InGaN. Accordingly, defect-controlling layer 21 can be made of GaN, AlGaN, or InGaN. Because of the existence of nanoparticles 111 in layer 21, most dislocations are terminated within layer 21, resulting in high quality epitaxial layer 25 and high quality active-region 30, which in turn translates into high internal quantum efficiency of the light-emitting device. In another embodiment of light-emitting device, the single defect-controlling layer 21 can be replaced with stacks of layer 21/layer 23 shown in FIG. 4.

The light-emitting structure shown in FIG. 5 can be processed into suitable light-emitting devices, by known methods in the art. In some embodiments (not shown in the figures), the structure shown in FIG. 5 can be processed into lateral geometry light-emitting diodes (LEDs), wherein p- and n-contacts are on the same side of substrate/template 10. In other embodiments, it can be processed into thin-film vertical geometry LEDs, wherein substrate/template 10 is removed and the structure is bonded to another superstrate 70, as shown in FIG. 6. Referring to FIG. 6, a transparent conductive layer 50, such as a p-type current spreading layer, for current spreading is formed over the p-type layer 40. Layer 50 can be a transparent metallic layer such as Ni/Au, NiO/Au, or a transparent conductive oxide layer such as zinc oxide (ZnO), indium tin oxide (ITO). Layer 50 can be a single layer or multiple layers. Over the transparent conductive layer 50 is a conductive reflector/mirror 60, which can be made of silver (Ag), aluminum (Al), or metallic layers like zirconium nitride (ZrN) and hafnium nitride (HfN). Working together with layer 50, reflector/mirror 60 is preferably to have a reflectivity above 90% in the visible spectrum region.

Superstrate 70 is preferred to have exceptional thermal and electric conductivity. Materials to make superstrate 70 can be selected from Cu, Pt, Pd, Ni, Ag, Au, Al, Co, W, Mo, Si, and their alloy. The material of superstrate 70 is preferred to be Cu or Cu alloy, considering its exceptional thermal and electric properties and commercial viability. Finally, a contact pad 82, such as a p-contact pad, is formed over the superstrate 70, and an n-contact pad 81 is formed over layer 21, as shown in FIG. 6. In some embodiments the n-contact and contact pad 81 can be formed over layer 25 by known method in the art.

The thin film vertical LED shown in FIG. 6 can be fabricated according to known teachings in the prior art, such as those disclosed in the U.S. Pat. No. 7,781,247 and patent application Ser. No. 12/953,290. Both U.S. Pat. No. 7,781, 247 and patent application Ser. No. 12/953,290 are herein incorporated by reference in its entirety.

In FIG. 6, the defect-controlling layer 21 can also enhance light-extraction efficiency because nanoparticles 111 possess different refractive index than that of layer 21. Nanoparticles 111 can enhance light scattering and increase light escape probabilities from the optical denser medium of layer 21 to its surrounding medium.

In addition, as illustrated in FIG. 6, nanoparticles 111 on or close to exposed surface of defect-controlling layer 21 can be removed, for example, by chemical etching with HF acid, leaving voids 111' with refractive index equal to 1 in the strongest contrast to that of layer 21, greatly enhancing light extraction efficiency.

Suitable nanoparticles can also be incorporated into the layers in the vicinity of the light-emitting region 30. As shown in the embodiment of FIG. 7, in the vicinity of active region 30, either above or below, or both, nanoparticles are incorporated. Below and above active region 30, in n-type layer 26 and p-type layer 41, nanoparticles 112 and 113 are in-situ incorporated while forming these layers, respectively, by the method described in connection with FIG. 3 using the system shown in FIGS. 1 and 2. The thickness of n-type layer 26 and p-type layer 41 can be from 0.1 to 1.0 μm, respectively. Nanoparticles 112 and 113 may have a size in the range of 1-100 nm, for example 1-10 nm, with density of $10^9$-$10^{10}$ $cm^{-2}$. The embodiment shown in FIG. 7 may further enhance light-extraction efficiency.

In other embodiments of the present invention, nanoparticles can also be precisely controlled and implemented into quantum wells. As shown in FIG. 8, nanoparticles 114 are incorporated into one or more quantum wells 32. In these embodiments, nanoparticles 114 can be $SiO_2$, $SiN_x$, $TiO_2$, and the like nanoparticles, with dimension from 1-10 nm, and density from $10^8$-$10^{12}$ cm$^{-2}$. Nanoparticles 114 modify quantum wells 32 into quantum dots or quantum disks 32', which may greatly enhance carrier radiative recombination rate, hence improve device's internal quantum efficiency. Nanoparticles 114 can be incorporated in-situ into one or more quantum wells 32 while epitaxially growing the quantum well 32 by the method described in connection with FIG. 3 using the system shown in FIGS. 1 and 2.

In other embodiments, nanoparticles 114 can also be nitride nanoparticles made of AlN, GaN, AlGaN, or InGaN. Nitride nanoparticles 114 can be formed in situ in the gaseous phase in the reactor, just before the formation of quantum well 32. Nitride nanoparticles 114 formed in the gaseous phase may have a dimension in the range of 1-10 nm. After the growth of quantum barrier 31, the growth conditions in the reactor are changed into favoring gaseous-phase reaction to form nitride nanoparticles in gaseous-phase, the formed nitride nanoparticles then are deposited on the quantum barrier 31. The growth conditions favoring gaseous-reaction of metalorganics and ammonia include high growth pressure, high growth temperature, high ammonia partial pressure, and low gas flow velocity, which are known in the art. In one embodiment, nanoparticles 114 are made of Al-containing nitride. The gaseous phase reaction to in situ form Al-containing nanoparticles 114 is conducted under the following conditions. The reactor pressure is increased to 500-760 torr, and growth temperature is raised to 750-850° C., and the reactor's ammonia partial pressure is increased, for example, up to 450-700 ton. Then with a short period of time (5-10 seconds) of introduction of metalorganics with a flow rate of 5-50 μmol/min, Al-containing nanoparticles are formed in situ in gaseous phase and deposited on quantum barrier 31 forming nanoparticles 114 on surface of quantum barrier 31. Then the growth conditions in the reactor are switched back into favoring quantum well epitaxial growth, and quantum well 32 epitaxially grows on quantum barrier 31 on the surface of which nitride nanoparticles have been deposited.

The in-situ formed nitride nanoparticles can also be deposited on substrate or template 10, defect-controlling layer 21, recovery layer 23, n-type layer 25, and other suitable layers in a similar manner described above.

In the embodiment shown in FIG. 8, a light emitting device has a quantum well containing nanoparticles 114 and a defect-controlling layer 21 containing nanoparticles 111 for better device quantum efficiency. Light emitting devices according to other embodiments of the present invention may have a quantum well containing nanoparticles 114, a defect-controlling layer 21 containing nanoparticles 111, an n-type layer 26 containing nanoparticles 112 and/or a p-type layer 41 containing nanoparticles 113.

What is claimed is:

1. A light emitting device comprising:
   a defect-controlling layer with nanoparticles dispensed therein; and
   a light emitting diode structure formed on the defect-controlling layer,
   wherein the nanoparticles are dispensed in the defect-controlling layer in-situ while the defect-controlling layer is formed,
   wherein the nanoparticles are dispensed in one or more sublayers of the defect-controlling layer, and the nanoparticles are uniformly dispensed in each of said one or more sublayers of the defect-controlling layer.

2. The light emitting device according to claim 1, wherein the light emitting diode structure comprises an n-type layer, a p-type layer, and an active region sandwiched therebetween, and the n-type layer is formed on the defect-controlling layer as a separate layer or as an integral part of the defect-controlling layer.

3. The light emitting device according to claim 2, further comprising another n-type layer sandwiched between the active region and said n-type layer, wherein said another n-type layer is formed on said n-type layer as a separate layer or as an integral part of said n-type layer, and wherein nanoparticles are dispensed in said another n-type layer.

4. The light emitting device according to claim 2, further comprising another p-type layer sandwiched between the active region and said p-type layer, wherein said another p-type layer and said p-type layer are formed as separate layers or as an integral layer, and wherein nanoparticles are dispensed in said another p-type layer.

5. The light emitting device according to claim 2, wherein the active region comprises one or more quantum wells and at least one of said one or more quantum wells contains nanoparticles.

6. The light emitting device according to claim 1, wherein the nanoparticles have a dimension in the range of 10-500 nm.

7. The light emitting device according to claim 1, further comprising a substrate or a template, on which the defect-controlling layer is formed.

8. A light emitting device comprising:
   a light emitting diode structure comprising an n-type layer, a p-type layer, and an active region sandwiched therebetween, wherein the active region comprises one or more quantum wells and at least one of said one or more quantum wells contains nanoparticles dispensed therein in-situ while forming said at least one quantum layer; and
   a defect-controlling layer with nanoparticles dispensed therein and on which the light emitting diode structure is formed, wherein the nanoparticles are dispensed in the defect-controlling layer in-situ while the defect-controlling layer is formed, the nanoparticles are dispensed in one or more sublayers of the defect-controlling layer, and the nanoparticles are uniformly dispensed in each of said one or more sublayers of the defect-controlling layer.

9. The light emitting device according to claim 8, wherein the n-type layer is formed on the defect-controlling layer as a separate layer or as an integral part of the defect-controlling layer.

10. The light emitting device according to claim 8, further comprising another n-type layer sandwiched between the active region and said n-type layer, wherein said another n-type layer is formed on said n-type layer as a separate layer or as an integral part of said n-type layer, and wherein nanoparticles are dispensed in said another n-type layer.

11. The light emitting device according to claim 8, further comprising another p-type layer sandwiched between the active region and said p-type layer, wherein said p-type layer and said another p-type layer are formed as separate layers or as an integral layer, and wherein nanoparticles are dispensed in said another p-type layer.

12. The light emitting device according to claim 8, wherein the nanoparticles in said at least one of said one or more quantum wells have a dimension in the range of 1-10 nm.

13. A defect-controlling structure for a semiconductor device comprising:
   a substrate;

a defect-controlling layer epitaxially grown over the substrate, wherein nanoparticles are dispensed in the defect-controlling layer in-situ while growing the defect-controlling layer; and an epitaxial layer on the defect-controlling layer, wherein the nanoparticles are dispensed in one or more sublayers of the defect-controlling layer, and the nanoparticles are uniformly dispensed in each of said one or more sublayers of the defect-controlling layer.

14. The defect-controlling structure according to claim 13, wherein density of the nanoparticles is different in different sublayers of the defect-controlling layer.

15. The defect-controlling structure according to claim 13, wherein a size of the nanoparticles is in the range of 1-100 nm.

16. The defect-controlling structure according to claim 13, wherein the nanoparticles are selected from silicon dioxide ($SiO_2$), silicon nitride ($SiN_x$), titanium dioxide ($TiO_2$), or their mixture.

17. The defect-controlling structure according to claim 13, further comprising a semiconductor device formed on the epitaxial layer.

18. The defect-controlling structure according to claim 17, wherein the semiconductor device is light emitting diode (LED).

19. The defect-controlling structure according to claim 13, wherein the substrate is made of sapphire, silicon, silicon carbide, gallium arsenide, gallium nitride, aluminum nitride, spinel, zinc oxide, diamond, quartz, glass, aluminum nitride ceramics, molybdenum, or graphite.

20. The defect-controlling structure according to claim 13, wherein the epitaxial layer is a III-nitride layer.

21. The defect-controlling structure according to claim 13, wherein the defect-controlling layer and the epitaxial layer are made of the same material and formed integrally in-situ in a continuous step.

22. The defect-controlling structure according to claim 1, wherein density of the nanoparticles is different in different sublayers of the defect-controlling layer.

23. The defect-controlling structure according to claim 8, wherein density of the nanoparticles is different in different sublayers of the defect-controlling layer.

* * * * *